United States Patent
Park

(10) Patent No.: US 9,990,979 B2
(45) Date of Patent: Jun. 5, 2018

(54) SEMICONDUCTOR MEMORY DEVICE CAPABLE OF REDUCING PEAK CURRENT WITH RESPECT TO EXTERNAL POWER IN MULTI-MEMORY DIE STRUCTURES

(71) Applicant: Samsung Electronics Co., Ltd., Suwon-si (KR)

(72) Inventor: Minsang Park, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/204,224

(22) Filed: Jul. 7, 2016

(65) Prior Publication Data

US 2017/0098469 A1   Apr. 6, 2017

(30) Foreign Application Priority Data

Oct. 2, 2015  (KR) .......................... 10-2015-0139241

(51) Int. Cl.
| | |
|---|---|
| G11C 5/14 | (2006.01) |
| G11C 11/4074 | (2006.01) |
| G11C 11/16 | (2006.01) |
| H01L 23/48 | (2006.01) |
| H01L 25/065 | (2006.01) |

(52) U.S. Cl.
CPC .......... *G11C 11/4074* (2013.01); *G11C 5/145* (2013.01); *G11C 11/1697* (2013.01); *H01L 23/481* (2013.01); *H01L 25/0657* (2013.01)

(58) Field of Classification Search
None
See application file for complete search history.

(56) References Cited

U.S. PATENT DOCUMENTS

| | | | | |
|---|---|---|---|---|
| 5,508,971 | A | * | 4/1996 | Cernea ................... G11C 16/30 365/185.14 |
| 5,677,649 | A | | 10/1997 | Martin |
| 6,172,932 | B1 | * | 1/2001 | Kim ....................... G11C 5/145 365/189.09 |
| 6,370,075 | B1 | | 4/2002 | Haeberli et al. |
| 6,577,535 | B2 | | 6/2003 | Pasternak |
| 7,023,260 | B2 | | 4/2006 | Thorp et al. |
| 7,688,665 | B2 | | 3/2010 | Kim et al. |
| 7,969,235 | B2 | | 6/2011 | Pan |
| 8,134,403 | B2 | | 3/2012 | Dhuyvetter et al. |
| 8,711,642 | B2 | | 4/2014 | Cornwell |
| 2008/0061842 | A1 | * | 3/2008 | Paraschou ............ H03K 5/1532 327/77 |
| 2012/0127812 | A1 | * | 5/2012 | Nishioka .............. G11C 7/1093 365/194 |

(Continued)

*Primary Examiner* — Son Dinh
*Assistant Examiner* — Uyen B Tran
(74) *Attorney, Agent, or Firm* — Muir Patent Law, PLLC

(57) ABSTRACT

A semiconductor memory device is disclosed that can differentially control a driving ability and current consumption of the charge pump circuit according to operation state information of other memory die. The semiconductor memory device includes a plurality of charge pump circuits installed on a plurality of memory dies, and a pump managing circuit installed on each of the memory dies to control the charge pump circuits and receive operation state information with respect to other memory die to generate control signals for controlling the charge pump circuits on its own memory die.

18 Claims, 10 Drawing Sheets

(56) References Cited

U.S. PATENT DOCUMENTS

2013/0201768 A1\* 8/2013 Kang ............... G11C 29/12005
                                                      365/189.09
2014/0293704 A1   10/2014 Ghalam et al.

\* cited by examiner

SEMICONDUCTOR MEMORY DEVICE CAPABLE OF REDUCING PEAK CURRENT WITH RESPECT TO EXTERNAL POWER IN MULTI-MEMORY DIE STRUCTURES

CROSS-REFERENCE TO RELATED APPLICATIONS

This U.S. non-provisional patent application claims the benefit of priority under 35 U.S.C. § 119 of Korean Patent Application No. 10-2015-0139241, filed on Oct. 2, 2015, in the Korean Intellectual Property Office, the contents of which are hereby incorporated by reference in its entirety.

BACKGROUND

The disclosed embodiments relate to semiconductor memory devices, and more particularly, to a semiconductor memory device capable of minimizing or reducing a peak current with respect to external power in a structure in which a plurality of memory dies is mounted on a substrate.

A mobile DRAM (dynamic random access memory) with high operating speed and low power consumption may be generally loaded into an electronic device like a smart phone.

The above mobile DRAM may be embodied in a multi-chip package form to increase memory capacity. For example, the multichip package may mean a structure in which a plurality of memory dies is vertically stacked on a substrate in one package. For example, memory dies formed on a lower portion and an upper portion of the substrate may have a structure of receiving a signal being provided from a controller in common, for example, a multi-rank structure. In a case where a plurality of memory dies is vertically stacked on a substrate, the memory dies may include a plurality of charge pumps that generate a voltage using external power.

Even in a case where a plurality of memory dies is horizontally arranged on the substrate, a plurality of charge pumps may be included in each of the memory dies.

If the plurality of charge pumps included in the plurality of memory dies is driven at once, consumption current amount becomes large compared with current amount being consumed when the charge pumps are driven sporadically, and thereby a peak current with respect to external power increases.

SUMMARY

According to certain embodiments, the disclosure is directed to a semiconductor memory device comprising: a plurality of memory dies including a first memory die and additional memory dies; a plurality of charge pump circuits installed on the plurality of memory dies, wherein the plurality of charge pump circuits includes a first charge pump circuit installed on the first memory die; and a first pump managing circuit which is installed on the first memory die, the first pump managing circuit configured to control the first charge pump circuit and receive operation state information with respect to the additional memory dies to generate one or more control signals for controlling the first charge pump circuit.

In some aspects, the disclosed embodiments further include wherein the memory dies are formed in a chip package.

In some aspects, the disclosed embodiments further include wherein the memory dies are connected to one another through a through silicon via (TSV).

In some aspects, the disclosed embodiments further include wherein the operation state information includes a power-up state with respect to additional memory dies.

In some aspects, the disclosed embodiments further include wherein the one or more control signals are further based on a current operation mode with respect to the first memory die.

In some aspects, the disclosed embodiments further include wherein the one or more control signals are further based on a voltage level detection information with respect to the first own memory die.

In some aspects, the disclosed embodiments further include wherein the one or more control signals comprise a signal that changes a period of an oscillating clock applied to the first charge pump circuit.

In some aspects, the disclosed embodiments further include wherein the one or more control signals comprise a signal for turning on or off the first charge pump circuit.

In some aspects, the disclosed embodiments further include wherein the one or more control signals comprise a signal for involving pumping drive devices in the first charge pump circuit in a charge pumping operation.

In some aspects, the disclosed embodiments further include wherein the first memory die is configured so that the additional memory dies of the plurality of memory dies whose operation state information will be used to control the first charge pump is set in advance.

In some aspects, the disclosed embodiments further include wherein each memory die includes a plurality of charge pump circuits, and the one or more control signals control the plurality of charge pump circuits of the first memory die.

According to certain embodiments, the disclosure is directed to a semiconductor memory device comprising: a plurality of memory dies; a plurality of voltage generators, wherein one voltage generator of the plurality of voltage generators is installed on one memory die of the plurality of memory dies and other voltage generators of the plurality of voltage generators are installed on other memory dies of the plurality of memory dies; and power managing circuits, wherein one power managing circuit of the power managing circuits is installed on the one voltage generator of the plurality of voltage generators to manage the whole power of a package by controlling the one voltage generator and receiving operation state information with respect to the other memory die to generate control signals for controlling the one voltage generator installed on the one memory die.

In some aspects, the disclosure further includes wherein the memory dies are vertically stacked on a substrate.

In some aspects, the disclosure further includes wherein each of the memory dies receives an address, a command, or data through a through substrate via.

In some aspects, the disclosure further includes wherein the memory dies are horizontally disposed with respect to each other and are connected in common to one memory controller.

According to certain embodiments, the disclosure is directed to a semiconductor memory device comprising: a plurality of memory dies; a plurality of charge pump circuits, wherein one charge pump circuit of the plurality of charge pump circuits is installed on one memory die of the plurality of memory dies and other charge pump circuits of the plurality of charge pump circuits are installed on other memory dies of the plurality of memory dies; and a plurality of pump managing circuits, wherein one pump managing circuit of the plurality of pump managing circuits is installed on one of the memory dies to control the one charge pump circuit and receive operation state information with respect to the other memory dies to generate control signals for controlling the one charge pump circuit installed on the one memory die.

In some aspects, the disclosure further includes wherein the control signals are based on a current operation mode with respect to the one memory die.

In some aspects, the disclosure further includes wherein the control signals are based on voltage level detection information with respect to the one memory die.

In some aspects, the disclosure further includes wherein the control signals comprise a signal that changes a period of an oscillating clock applied to the one charge pump circuit.

In some aspects, the disclosure further includes wherein the control signals comprise a signal for turning on or off additional charge pump circuits installed on the one memory die.

BRIEF DESCRIPTION OF THE FIGURES

Embodiments of the concepts will be described below in more detail with reference to the accompanying drawings. The disclosed embodiments may, however, be embodied in different forms and should not be constructed as limited to the embodiments set forth herein. Like numbers refer to like elements throughout.

DETAILED DESCRIPTION

Figure 1:
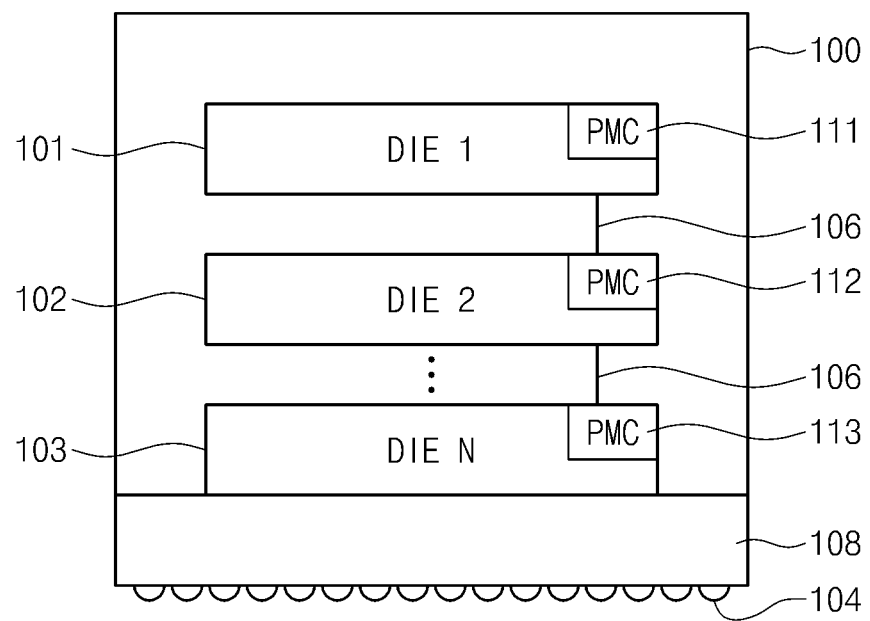
FIG. 1 is a block diagram illustrating a package structure including a semiconductor memory device in accordance with some exemplary embodiments.

Embodiments will be described more fully hereinafter with reference to the accompanying drawings, in which embodiments are shown. These concepts may, however, be embodied in many different forms and should not be construed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

It will be understood that when an element is referred to as being "on," "connected to," "electrically connected to," or "coupled to" another element, it can be directly on, connected to, electrically connected to, or coupled to the other element or intervening elements may be present. In contrast, when an element is referred to as being "directly on," "directly connected to," "directly electrically connected to," or "directly coupled to" another component, or as "contacting" or "in contact with" another element, there are no intervening elements present. Other words used to describe the relationship between elements or layers should be interpreted in a like fashion (e.g., "between" versus "directly between," "adjacent" versus "directly adjacent,"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the text indicates otherwise, these terms are only used to distinguish one element, component, region, layer or section from another element, component, region, layer or section. For example, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing certain embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Unless otherwise defined, all terms (including technical and scientific terms) used herein have the same meaning as commonly understood by one of ordinary skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory. A chip or package that includes the semiconductor devices may also be referred to generally as a semiconductor device.

Reference will now be made to example embodiments, which are illustrated in the accompanying drawings, wherein like reference numerals may refer to like components throughout.

FIG. 1 is a block diagram illustrating a package structure including a semiconductor memory device in accordance with some embodiments.

Referring to FIG. 1, a plurality of memory dies (e.g., 101, 102, 103) is stacked on a substrate 108. In the exemplary embodiment of FIG. 1, the first memory die 101 may have a first power managing circuit 111, the second memory die 102 may have a second power managing circuit 112, and the Nth memory die 103 may have an Nth power managing circuit 113. Although three memory dies (101, 102, 103) are illustrated, a greater or fewer number of memory dies may be stacked on substrate 108.

The memory dies (101, 102, 103) may be packaged in one package 100 to form a multichip package (MCP) structure. A plurality of bumps 104 for an electrical connection may be formed on a lower portion of the substrate 108, which may also be referred to as a package substrate. The bumps 104 are in charge of an electrical connection between the memory dies (101, 102, 103) and a processor or a memory controller that may be located at a lower portion of the substrate 108 (e.g., below the substrate). In some embodiments, the bumps 104 may provide an electrical connection between the memory dies (101, 102, 103) and one or more electrical circuits located below or at a lower portion of the substrate 108.

The memory dies (101, 102, 103) can receive an address, a command, or data through an interconnection line 106. The interconnection line 106 may be formed of a through-silicon via (TSV).

A plurality of charge pump circuits that generate various internal required voltages using external power may be installed at each of the memory dies (101, 102, 103). In some embodiments, pump managing circuits may control the charge pump circuits. A circuit that includes the plurality of charge pump circuits may be referred to as a voltage generator.

The first power managing circuit (PMC) 111 functions as a pump managing circuit that generates control signals to control the charge pump circuits in the memory die 101. The first PMC 111 can receive operation state information with respect to the memory dies (101, 102, 103). For instance, the first PMC 111 may receive power-up information from one or more of the memory dies to generate the control signals. Herein, the first PMC 111, which is a pump managing circuit, is installed in the memory die 101 among the memory dies (101, 102, 103) to control the charge pump circuits of the memory die 101. By doing so, the PMC 111 can manage the power of the package.

The second PMC 112 functions as a pump managing circuit that generates control signals to control the charge pump circuits in the memory die 102. The second PMC 112 can receive operation state information with respect to the memory dies (101, 102, 103). For instance, the second PMC 112 may receive power-up information from one or more of the memory dies to generate the control signals. Herein, the second PMC 112, which is a pump managing circuit, is installed in the memory die 102 among the memory dies (101, 102, 103) to control the charge pump circuits of the memory die 102. By doing so, the PMC 112 can manage the power of the package.

The Nth power managing circuit (PMC) 113 functions as a pump managing circuit that generates control signals to control the charge pump circuits in the memory die 103. The Nth PMC 113 can receive operation state information with respect to the memory dies (101, 102, 103). For instance, the Nth power managing circuit 113 may receive power-up information from one or more of the memory dies to generate the control signals. Herein, the Nth PMC 113, which is a pump managing circuit, is installed in the memory die 103 among the memory dies (101, 102, 103) to control the charge pump circuits of the memory die 103. By doing so, the PMC 113 can manage the power of the package.

According to the above embodiments, a plurality of power management circuits 111 included in a plurality of respective dies (101, 102, 103) can together manage the power of the entire package 100.

In some embodiments, the memory dies (101, 102, 103) may include a mobile DRAM.

Normal memory cells and spare memory cells may exist in a memory cell array of the mobile DRAM. The normal memory cells may have the same size and form as the spare memory cells. One DRAM memory cell may be constituted by, for example, one access transistor and one storage capacitor.

As used herein, the term "active action" may refer to an operation of enabling a word line connected to an access transistor of a selected memory cell to read data from a memory cell or to write data to a memory cell.

Although it is described that the memory cell array included in the memory die is constituted by DRAM cells, the disclosed concepts are not limited thereto and, in some exemplary embodiments, magnetic RAM (MRAM) cells may constitute the memory cell array.

When a volatile semiconductor memory device such as a static RAM (SRAM) or a DRAM loses its stored data when its power supply is interrupted. In contrast, a nonvolatile memory device such as a MRAM retains its stored data even when its power is interrupted. Thus, in a case where loss of data is not wanted when a power supply is interrupted, a nonvolatile memory device is used to store data rather than a volatile memory device. For example, in a case of a spin transfer torque magnetic random access memory (STT-MRAM), the advantages of a MRAM may be combined with the advantages of a DRAM. A STT-MRAM cell may include a magnetic tunnel junction (MTJ) device and a select transistor. Generally, the MTJ device may include a fixed layer, a free layer, and a tunnel layer between the fixed layer and the free layer. A magnetization direction of the fixed layer is fixed, and the free layer may have the same magnetization direction as the fixed layer or, depending on the conditions, the free layer may have a magnetization direction opposite to the fixed layer.

A high bandwidth memory (HBM), or a stacked chip structure, has been gaining attention to provide high performance like large capacity and a high speed operation.

The HBM is one type of a memory structure having a form in which a plurality of memory dies is stacked on a buffer die (or base die) that performs as a logic circuit. The buffer die and the plurality of memory dies may be connected to one another by a through silicon via (TSV) to transmit and receive data and control signals to and from each other.

2.5-dimensional (2.5D) chip structures and three-dimensional (3D) chip structures have been known as stacked chip structures The 2.5D chip structure is a chip structure in which the HBM and a host are connected to each other using an interposer instead of a printed circuit board (PCB) for an electrical connection. The 3D chip structure is a chip structure in which the HBMs are stacked on an upper portion of a host and thereby the host and the HBM are directly connected to each other.

Figure 2:
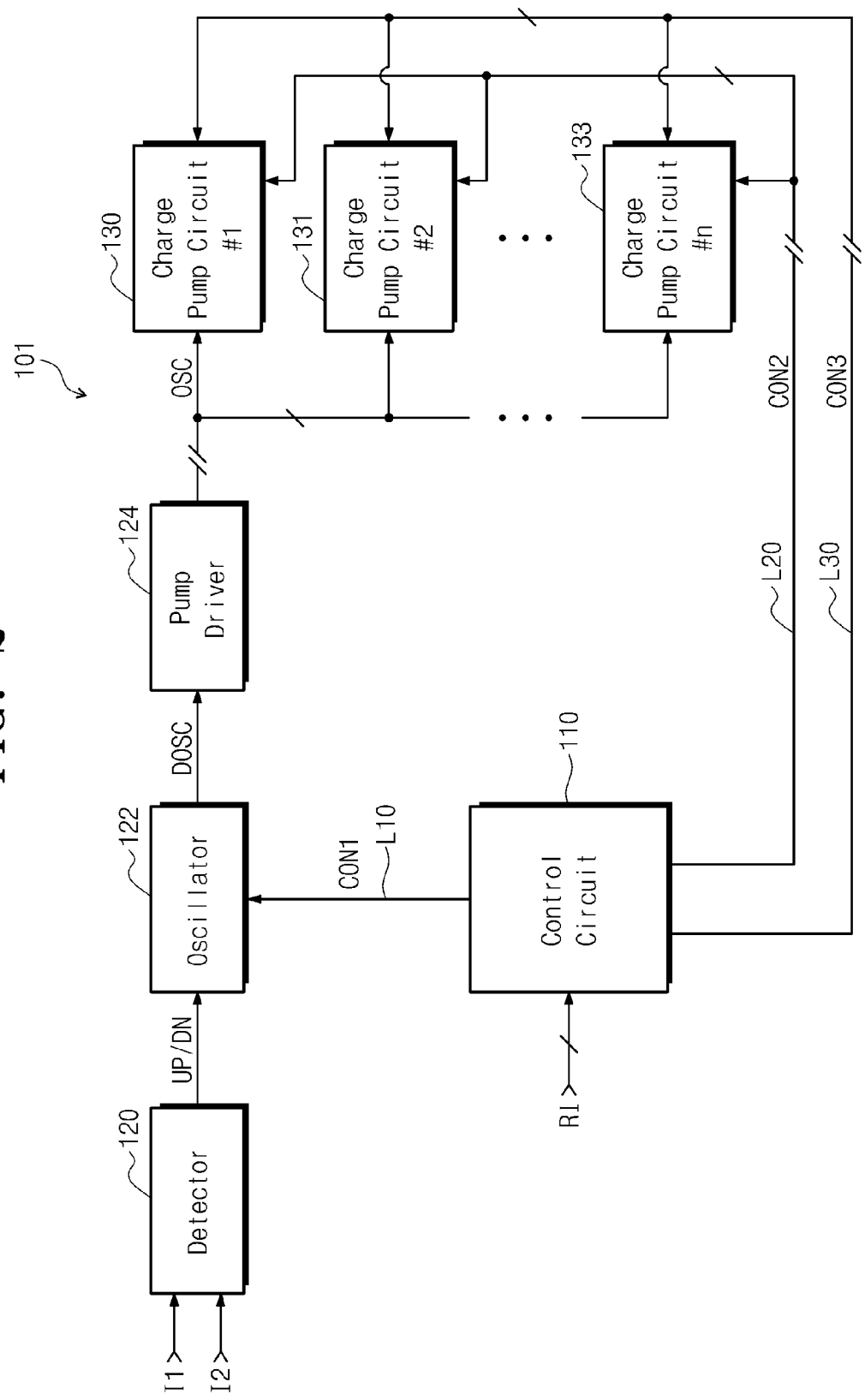
FIG. 2 is a drawing for explaining a control operation of a charge pump circuit in a semiconductor memory device in accordance with some exemplary embodiments.

FIG. 2 is a drawing for explaining a control operation of a charge pump circuit in a semiconductor memory device in accordance with some exemplary embodiments.

Referring to FIG. 2, the semiconductor memory device includes a detector 120, an oscillator 122, a pump driver 124, charge pump circuits (130, 131, 133) and a control circuit 110. Although only three charge pump circuits (130, 131, 133) are illustrated in FIG. 2, there may be fewer or more charge pump circuits.

The detector 120 receives a reference input I1 and a feedback input I2 of the one or more of the charge pump circuits (130, 131, 133), and detects a comparison difference between the reference input I1 and the feedback input I2. The comparison difference may take the form of an up/down (UP/DN) signal. For example, the detector 120 may receive the reference input I1 and the feedback input I2, and may compare the reference input I1 with the feedback input I2. When the reference input I1 is higher than the feedback input I2, an UP signal is output, and when the reference input I1 is lower than the feedback input I2, a DN signal is output. The UP/DN signal may be output by the detector 120 and may be received as input to the oscillator 122. The oscillator 122 is activated by the UP/DN signal to output a driving oscillation signal DOSC. The oscillator 122 adjusts a period of the driving oscillation signal DOSC in response to a first control signal CON1. The driving oscillation signal DOSC output by the oscillator 122 may be received as input to the pump driver 124.

The pump driver 124 is activated by the driving oscillation signal DOSC to output an oscillating clock OSC. The oscillating clock OSC output by the pump driver 124 may be received as input to one or more of the charge pump circuits (130, 131, 133).

The charge pump circuit 130 performs a charge pumping operation according to the oscillating clock OSC.

The charge pump circuit 130 may adjust a charge transmission time in response to a second control signal CON2, and may be turned on or turned off depending on a state of a third control signal CON3. In one embodiment, operations of the remaining charge pump circuits (131, 133) are the same as that of the charge pump circuit 130. For example, the charge pump circuits (131, 133) may adjust charge transmission times in response to a second control signal CON2, and may be turned on or off depending on a state of a third control signal CON3. The second control signal CON2 and the third control signal CON3 may be output by the control circuit 110, and may be received as input to one or more of the charge pump circuits (130, 131, 133).

In some embodiments, the control circuit 110 may correspond to a power managing circuit that functions as the pump managing circuit of FIG. 1.

The control circuit 110 receives reference information RI to generate control signals for controlling a plurality of charge pump circuits (130, 131, 133). The reference information RI used in generating control signals for controlling a memory die may include operation state information of other memory dies, such as, for instance, power up information. For example, in FIG. 1, in an operation of the first memory die 101, power up information of the second memory die 102 or the Nth memory die 103 may be provided as the reference information RI. In this case, in an operation of the first memory die 101, power up information of all other memory dies does not necessarily need to be provided. For example, in an operation of the first memory die 101, power up information of the second memory die 102 and the Nth memory die 103 may be referenced and in an operation of the second memory die 102, power up information of the first memory die 101 and the Nth memory die 103 may be referenced. Other memory dies to be referenced in an operation of any memory die may be set in advance.

The reference information RI used in generating control signals for controlling a memory die may include a current operation mode with respect to that memory die. For instance, when a memory die is generating the control signals, the current operation mode may be more reflected in the reference information RI. For example, during operation of the first memory die 101, an operation mode of the first memory die 101 (e.g., an active mode or a standby mode) may be involved in generation of the control signals. Since in the standby mode, power consumption is smaller compared with that in the active mode, all the charge pump circuits do not need to be turned on while in the standby mode. Also, in this case, charge transmission time may be slowed down by adjusting the number of participating transistors involved in a charge pumping in a charge pump circuit (130, 131, 133). The active mode indicates an operation of activating a word line to a high voltage level higher than a power supply voltage. For example, a word line of a memory cell selected in a read operation or a write operation is activated to a high voltage level.

The reference information RI used in generating control signals for controlling a memory die may include voltage level detection information with respect to that memory die. For example, in a case where an output voltage of an internal power supply voltage generator is lower than a reference level set in a monitoring section, the number of charge pump circuits (130, 131, 133) being turned on increases or charge transmission time may be rapidly controlled.

The control circuit 110 can output the first control signal CON1 through a line L10. The first control signal CON1 is applied to the oscillator 122. The oscillator 122 outputs a driving oscillation signal DOSC for changing a period of an oscillating clock OSC being applied to the plurality of charge pump circuits (130, 131, 133) in response to the first control signal CON1.

In a case where the first control signal CON1 is a signal that slows down a frequency of the driving oscillation signal DOSC, a driving ability of the pump driver 124 becomes relatively weak and a period of the oscillating clock OSC increases. For example, when the driving ability of the pump driver 124 becomes weaker, the frequency of the oscillating clock OSC may decrease. In contrast, in a case where the first control signal CON1 is a signal that speeds up a frequency of the driving oscillation signal DOSC, a driving ability of the pump driver 124 becomes relatively strong and a period of the oscillating clock OSC is reduced. For example, when the driving ability of the pump driver 124 becomes stronger, the frequency of the oscillating clock OSC may increase. As a period of the oscillating clock OSC is reduced, a charge pumping ability of the charge pump circuit increases.

The control circuit 110 can output the second control signal CON2 through a line L20. The second control signal CON2 is applied to each of the respective plurality of charge pump circuits (130, 131, 133). In some embodiments, referring to FIG. 5, the second control signal CON2 may be a signal for involving pumping drive devices (DT1, DT2, DTn) of the plurality of charge pump circuits (130, 131, 133) in a charge pumping operation. For example, pumping drive devices (DT1, DT2, DTn) are selectively involved in a charge pumping operation according to a switching of respective switching devices (SW1, SW2, SWn) in a second switching unit SU2 of FIG. 5.

Figure 5:
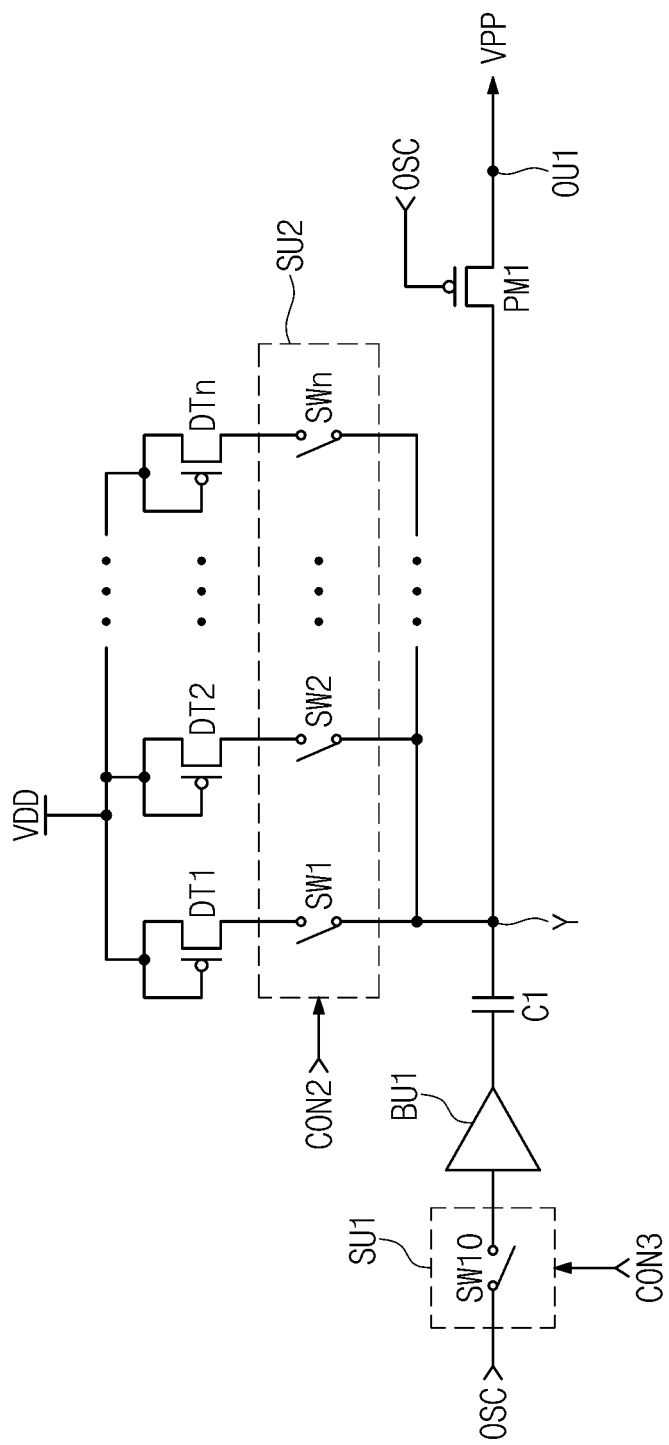
FIG. 5 is a drawing illustrating a charge pump circuit of FIG. 2.

Returning to FIG. 2, the control circuit 110 can output the third control signal CON3 through a line L30. The third control signal CON3 is applied to each of the respective plurality of charge pump circuits (130, 131, 133). The third control signal CON3 may be a signal for turning on or turning off the plurality of charge pump circuits (130, 131, 133), respectively. For example, the charge pump circuit 130 may be turned on or turned off depending on a state of the third control signal CON3 allocated to the charge pump circuit 130 and transmitted through the line L30. Referring to FIG. 5, in a case where the charge pump circuit 130 is turned off, a switching device SW10 in a first switching unit SU1 is opened and thereby an oscillating clock OSC is not applied to a buffer BU1.

Figure 3:
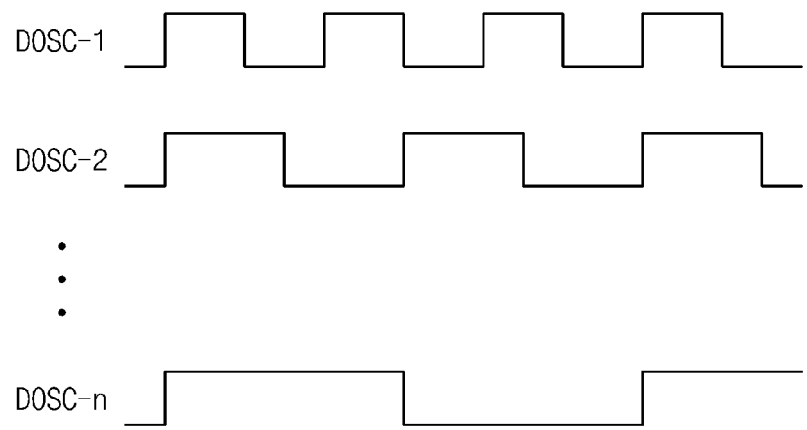
FIG. 3 is a drawing illustrating an output of an exemplary oscillator controlled by a control circuit of FIG. 2.

FIG. 3 is a drawing illustrating an output of an oscillator controlled by an exemplary control circuit of FIG. 2, according to certain embodiments.

Referring to FIG. 3, various types of driving oscillation signals being output from the oscillator 122 are illustrated. A first driving oscillation signal DOSC-1 is an output signal having the shortest period and the highest frequency, a second driving oscillation signal DOSC-2 is an output signal having a longer period and lower frequency than the first driving oscillation signal DOSC-1, and an nth driving oscillation signal DOSC-n is an output signal having the longest period and lowest frequency. In a case where the nth driving oscillation signal DOSC-n is driven by the first control signal CON1, a driving ability of the pump driver 124 becomes lowest and a period of the oscillating clock OSC increases.

In a case where the first driving oscillation signal DOSC-1 is driven by the first control signal CON1, a driving ability of the pump driver 124 becomes highest and a period of the oscillating clock OSC relatively is reduced. As a period of the oscillating clock OSC is reduced, a charge pumping ability of a charge pump circuit increases.

Figure 4:
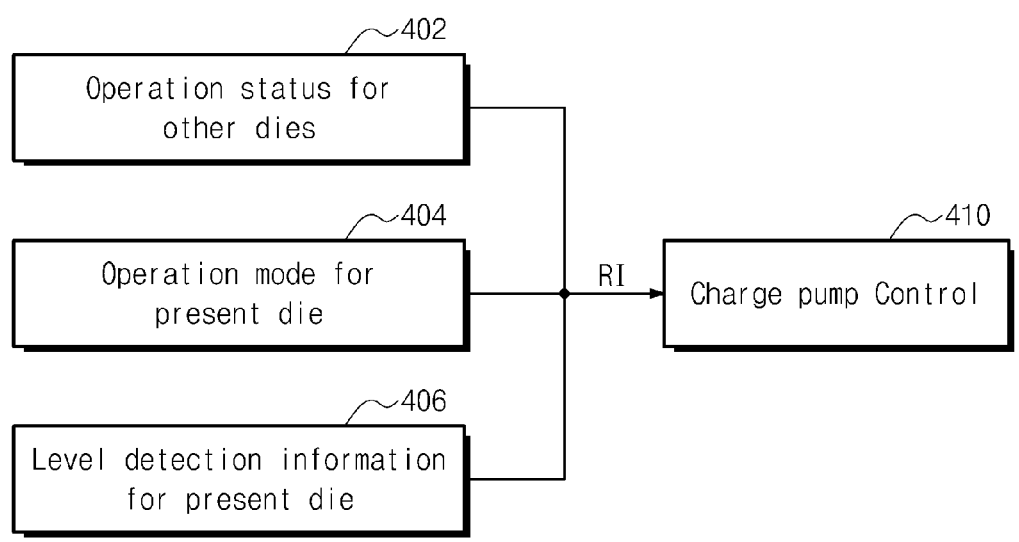
FIG. 4 is a drawing for explaining a control operation of a power managing circuit in accordance with some exemplary embodiments.

FIG. 4 is a drawing for explaining a control operation of a power managing circuit in accordance with some exemplary embodiments.

Referring to FIG. 4, operation state information of other memory dies is received to form reference information (RI) for a present memory die (402). Also, operation mode information of the present memory die (a current memory die) is received (404), and level detection information of the present memory die is received (406). At least one of power up information of other memory dies, information about an active mode or a standby mode of a present memory die, and voltage level detection information of the present memory die may be used as reference information RI to generate control signals (410). In a case where the information described above is received, the control circuit 110 can generate the control signals to control charge pump circuits (130, 131, 133). Accordingly, since a driving ability and current consumption of the charge pump circuits (130, 131, 133) are differentially controlled in a structure in which a plurality of memory dies is loaded, not only an internal power supply capacity is stabilized but also an amount of currents being simultaneously consumed with respect to external power is reduced, thereby reducing a peak current.

FIG. 5 is a drawing illustrating an exemplary charge pump circuit of FIG. 2, according to certain embodiments.

Referring to FIG. 5, each charge pump circuit may include a buffer BU1, a capacitor C1, a P-type MOS transistor PM1, and diode coupled P-type MOS transistors (DT1, DT2, . . . , DTn). The charge pump circuit of FIG. 5 may further include a first switching unit SU1 and a second switching unit SU2.

The switching device SW10 of the first switching unit SU1 may operate in response to a received third control signal CON3. For example, if a switching device SW10 of the first switching unit SU1 is closed according to the third control signal CON3, the oscillating clock OSC is applied to an input stage of the buffer BU1. If the switching device SW10 of the first switching unit SU1 is opened according to the third control signal CON3, the oscillating clock OSC is not applied to an input stage of the buffer BU1. For example, the switching device SW10 may switch (i.e., open or close) in response to a received third control signal CON3, and the open or close status of SW10 may selectively cause the oscillating clock OSC to be applied (or not) to an input stage of the buffer BU1. In a case where the oscillating clock OSC is cut off, an operation of the charge pump circuit illustrated in FIG. 5 is disabled.

Switching devices (SW1, SW2, . . . , SWn) of the second switching unit SU2, which are closed according to the second control signal CON2, and the diode coupled P-type MOS transistors (DT1, DT2, . . . , DTn), which function as a pumping drive device, are all involved in a charge pumping operation. For example, the switching devices (SW1, SW2, . . . , SWn) may switch (i.e., open or close) in response to a received second control signal CON2, and the open or close status of the switching devices (SW1, SW2, . . . , SWn) may selectively cause the diode coupled P-type MOS transistors (DT1, DT2) to perform the charge pumping operation.

If the switching devices (SW1, SW2) among the switching devices (SW1, SW2, . . . , SWn) are closed in response to the second control signal CON2, only the diode coupled P-type MOS transistors (DT1, DT2) are involved in the charge pumping operation. In this case, a charge transmission time is slow compared with a case where all the switching devices (SW1, SW2, . . . , SWn) are closed. For example, in a case where an internal operation is not an active mode (e.g., a standby mode), since power consumption is relatively small, only some of the switching devices (SW1, SW2, . . . , SWn) may be controlled to be involved in the charge pumping operation.

In FIG. 5, the charge pump circuit 130 generates a high peak-to-peak voltage VPP by performing the charge pumping operation in synchronization with the oscillating clock OSC.

A charge node Y of the charge pump circuit 130, in a case where at least one of the switching devices (SW1, SW2, . . . , SWn) is closed, is precharged to a power supply voltage level. The high voltage VPP at a pumping output node OU1 of the charge pump circuit 130 is fed back to the detector 110, as shown in FIG. 2, to be compared with a reference voltage. If the high voltage VPP is lower than the reference voltage, an up signal is output to be applied to the oscillator 112. The oscillating clock OSC is generated from the pump driver 124 by an output of the oscillator 112 and in a case where the switching device SW10 is closed, the generated oscillating clock OSC is applied to the buffer BU1 in the charge pump circuit 130. In this example, the oscillating clock OSC is also applied to a gate of the P-type MOS transistor PM1.

In a case where the oscillating clock OSC transitions from low to high, a voltage of the charge node Y precharged to a level of the power supply voltage VDD increases to a voltage which is the sum of the power supply voltage and a high level voltage of the oscillating clock by a coupling operation. In this case, the P-type MOS transistor PM1 is in a turn-off state.

In a case where the oscillating clock OSC transitions from high to low, as a charge pumping operation of the capacitor C1 is stopped and the P-type MOS transistor PM1 becomes a turn-on state, the voltage of the charge node Y increases to a voltage which is the sum of the power supply voltage VDD and the high level voltage of the oscillating clock transmitted to the pumping output node OU1. Accordingly, an equalizing operation is performed and thereby the voltage of the charge node Y begins to decrease toward the level of the power supply voltage VDD.

In some embodiments, when a charge pumping operation resumes (e.g., where the oscillating clock OSC transitions from low to high), the P-type MOS transistor PM1 changes to a turn-off state and the voltage level of the charge node Y precharged to the level of the power supply voltage increases again to the voltage which is the sum of the power supply voltage VDD and the high level voltage of the oscillating clock OSC.

In FIG. 5, the switching device SW10 takes charge of an on/off operation of the charge pump circuit 130. An adjustment of a charge transmission time is performed by controlling a switching operation of the switching devices (SW1, SW2, . . . , SWn).

Although FIG. 5 illustrates three diode coupled P-type MOS transistors (DT1, DT2, and DTn) and three switching devices (SW1, SW2, and SWn), an exemplary charge pump circuit may include fewer or more diode coupled P-type MOS transistors and/or switching devices.

In accordance with the above embodiments, each die of a plurality of dies in a stacked semiconductor package may include a control circuit, and a plurality of pump charge circuits. The control circuit may be part of a power managing circuit. The control circuit may receive input (e.g., RI) indicating various operational states of the particular die as well as of the other dies in the package. The operational states may reflect an amount of power usage in the different dies. For example, certain dies may be in a power-up mode, others maybe in an active mode, and others in a standby mode. Based on the modes of the different dies, a given power management circuit can determine how to control charge pump circuits on its corresponding die. For example, a power management circuit on a first die may be configured such that if a number of the other dies are in a state that consumes a significant amount of power (e.g., in a power-up mode), the power management control circuit controls the charge pump circuits on the first die to change frequency controls of some of the charge pump circuits on the first die to conserve power.

Figure 6:
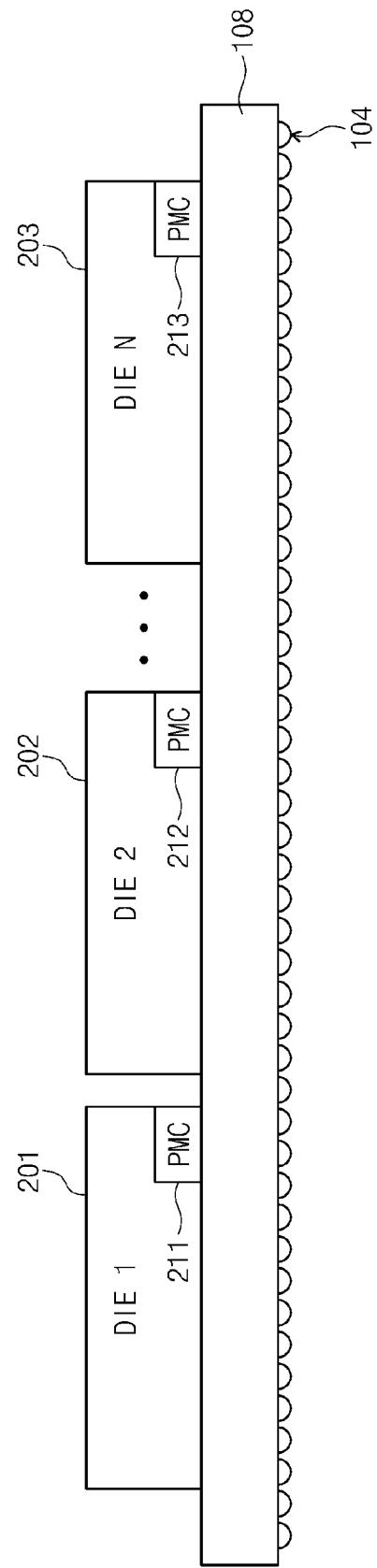
FIG. 6 is a drawing illustrating a disposition structure of memory dies in accordance with some exemplary embodiments.

FIG. 6 is a drawing illustrating a disposition structure of memory dies in accordance with some other exemplary embodiments.

In FIG. 6, unlike the structure of FIG. 1, memory dies (201, 202, 203) are horizontally disposed above a substrate 208. For example, a first memory die 201 may be disposed on the same layer as other memory dies, such as, for example, a second memory die 202 and an Nth memory die 203. In some embodiments, the layer on which the memory dies (201, 202, 203) are disposed may be on a substrate 208. A first power managing circuit (PMC) 211 is loaded into the first memory die 201 to generate control signals for controlling a plurality of charge pump circuits installed in the first memory die 201. For example, the first PMC 211 functions as a pump managing circuit that generates the control signals.

A second PMC 212 is loaded into the second memory die 202 to generate control signals for controlling a plurality of charge pump circuits installed in the second memory die 202. For example, the Nth PMC 213 functions as a pump managing circuit that generates the control signals for the second memory die 202. An Nth power managing circuit 213 is loaded into the Nth memory die 203 to generate control signals for controlling a plurality of charge pump circuits installed in the Nth memory die 203. For example, the Nth PMC 213 functions as a pump managing circuit that generates the control signals for the Nth memory die 203.

As illustrated in FIG. 6, in a case where memory dies (201, 202, 203) are disposed horizontally, operation state information of other memory die may be provided by a communication among memory dies (201, 202, 203) or through a memory controller.

In each of the memory dies (201, 202, 203), an impedance matching circuit (e.g., an on-die termination or an on-chip termination) may be loaded near a pad in each of the memory dies (201, 202, 203). In embodiments having the on-die termination, a source termination is done in a transmission side and in a reception side, and a parallel termination is done by a termination circuit connected in parallel with respect to a reception circuit connected to an input pad. As a signal transmission speed becomes high in a memory for a high speed operation, a swing width of a signal being interfaced between a memory controller and a DRAM is gradually reduced to minimize a delay time that occurs in a signal transmission. As a swing width of a signal is reduced, an effect on an external noise increases and a signal reflection due to impedance mismatching in an interface unit becomes important. If a mismatching occurs in a process of signal transmission, a signal integrity issue may be caused. In a case where signal integrity is degraded, high speed signal transmission becomes difficult and an error may occur in an access operation including write and read operations of a DRAM. Thus, an on-die termination may be executed with respect to each of the memory dies.

Figure 7:
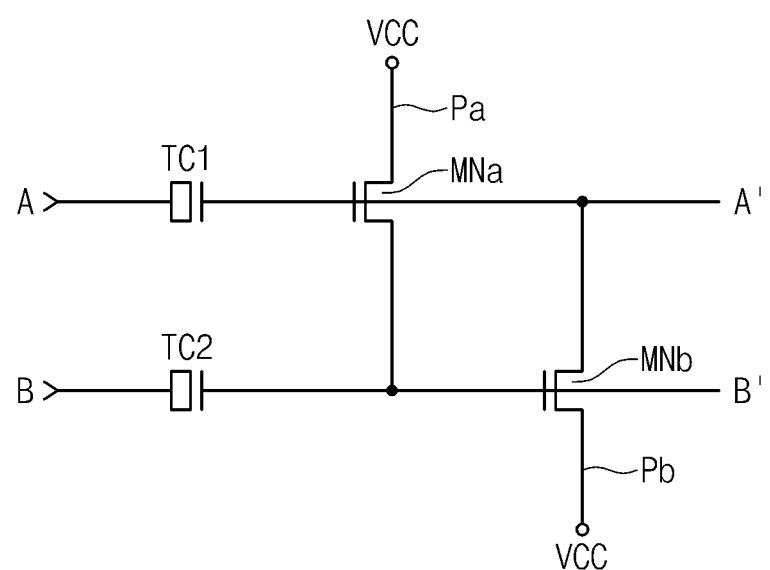
FIG. 7 is an illustrative view of an exemplary charge pump circuit applied to FIG. 6.
Figure 8:
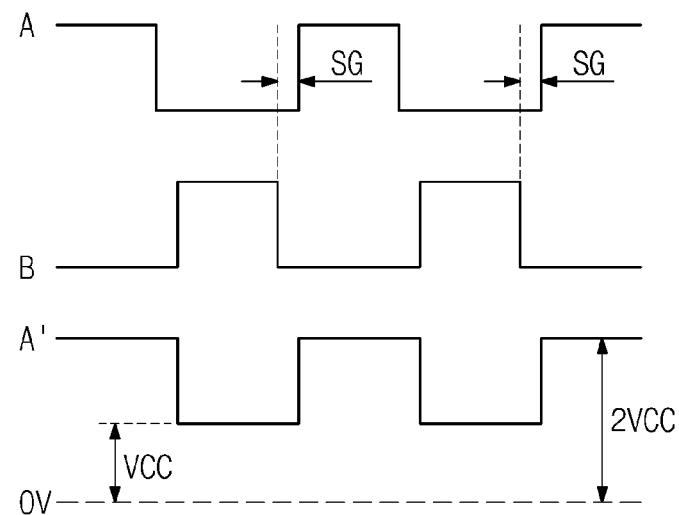
FIG. 8 is an exemplary operation timing diagram in accordance with FIG. 7.

FIG. 7 is an illustrative view of an exemplary charge pump circuit applied to FIG. 6. FIG. 8 is an exemplary operation timing diagram in accordance with FIG. 7.

Referring to FIG. 7, as illustrated in FIG. 8, an input signal A and an input signal B is clocked while having phases opposite to each other. Input signal A may be applied to transistor/capacitor TC1, and input signal B may be applied to transistor/capacitor TC2. Transistor/capacitors, such as TC1 and TC2, may be transistors configured to function as capacitors. For example, when the input signal A transitions from low to high, the input signal B transitions from high to low and vice versa. When the input signals A and B move between a zero value and a power supply voltage VCC in the circuit of FIG. 7, output signals A' and B' move between the power supply voltage VCC and a power supply voltage 2 VCC, which is two times the power supply voltage VCC. In a case where the input signal A moves between 0 v to the VCC, as illustrated in FIG. 8, a voltage at a node A' varies from the VCC to the 2 VCC. At this time, a voltage at a node B' has to be lowered to a level that can turn off an N-type transistor MNb in advance. Otherwise, charges of the node A' are discharged through the N-type transistor MNb. In that case, a desired raised voltage electric potential is not made at the node A'. Thus, the two input signals A and B should accurately move with phases opposite to each other while having a time difference. For example, the input signals A and B may have opposite phases, but the input signals A and B may have a timing skew. Before one input signal that moves from low to high between the two input signals A and B occurs, the other input signal should already transition from high to low and vice versa. As illustrated in FIG. 8, the transition of input signals A and B is controlled so that a width (SG) of timing skew remains constant. In one exemplary embodiment of FIG. 7, an on/off control and a charge transmission time control of the charge pump circuit may be performed by changing a structure of FIG. 7 such that it is similar to the structure of FIG. 5 and adding switching devices.

Figure 9:
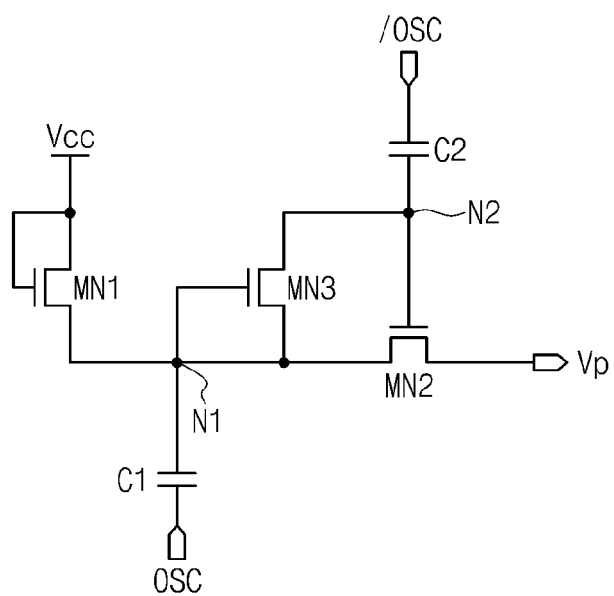
FIG. 9 is another illustrative view of an exemplary charge pump circuit applied to FIG. 6.
Figure 10:
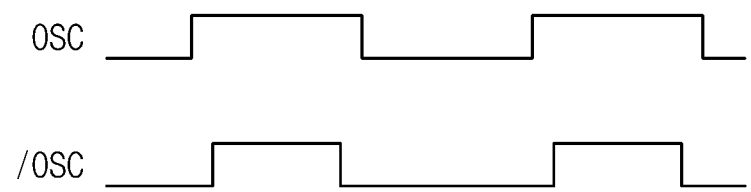
FIG. 10 is an exemplary operation timing diagram in accordance with FIG. 9.

FIG. 9 is another exemplary illustrative view of a charge pump circuit applied to FIG. 6. FIG. 10 is an exemplary operation timing diagram in accordance with FIG. 9.

Referring to FIG. 9, a first MOS transistor MN1 receives a power supply voltage VCC to its gate and drain/source terminal, and provides an initial voltage on a first node N1 through its source/drain terminal. A first capacitor C1, which may be a main capacitor, has a predetermined capacitance value. One end plate of the first capacitor C1 is connected to the first node N1 and the other plate of the first capacitor C1 receives a first oscillating signal OSC. A third MOS transistor MN3 connects its gate and source/drain terminal to the first node N1 to provide a current of the first node N1 to its own drain/source terminal. A second capacitor C2, which may be a sub capacitor, has a capacitance value smaller than the capacitance value of the first capacitor C1. One plate of the second capacitor C2 is connected to a second node N2 which is the drain/source terminal of the third MOS transistor MN3, and the other plate of the second capacitor C2 receives a second oscillating signal/OSC. A second MOS transistor MN2 connects its drain terminal to the first node N1, connects its gate terminal to the second node N2 and connects its source terminal to an output terminal Vp. The gate of a second MOS transistor MN2 may be connected to the first node N1, the drain/source terminal of the second MOS transistor MN2 may be connected to the source/drain terminal of the third MOS transistor MN2 and the node N1, and the source/drain terminal of the second MOS transistor MN2 may be connected to the output node Vp. The second MOS transistor MN2 provides a voltage at the first node N1 to the output node Vp in response to a voltage of the second node N2.

The first, second and third transistors MN1, MN2 and MN3 are general N-type MOS transistors and the first and second capacitors C1 and C2 are general MOS capacitors having different capacitance values.

The first oscillating signal OSC is a clock signal oscillated on a regular cycle by an oscillator formed in the semiconductor memory device and is the same as an OSC waveform illustrated in FIG. 10. The second oscillating signal/OSC has the same period as the first oscillating signal OSC and has a pulse width smaller than the first oscillating signal OSC. The second oscillating signal/OSC is the same as a/OSC waveform. An output voltage of the charge pump circuit is provided to the output terminal Vp of FIG. 9.

In FIG. 9, the first transistor MN1 connects its gate and one drain/source terminal to the power supply voltage Vcc and connects its other source/drain terminal to the first node N1. The first transistor MN1 sets an initial voltage of the first node N1 to a voltage of the power supply voltage Vcc—a threshold voltage Vth1 of the first transistor MN1 and, in a case where a voltage at the first node N1 is higher than the power supply voltage Vcc, the first transistor MN1 prevents a current from reversely flowing from the first node N1 toward the power supply voltage. The second transistor MN2 connects its one source/drain terminal to the first node N1, connects its other source/drain terminal to the output terminal Vp, and connects its gate terminal to the second node N2. In a case where a voltage at the first node N1 is higher than a voltage at the output terminal Vp, the second transistor MN2 transmits a current from the first node N1 to the output terminal Vp. In a case where the voltage at the output terminal Vp is higher than the voltage at the first node N1, the second transistor MN2 prevents a current from reversely flowing from the output terminal Vp toward the first node N1. The third transistor MN3 connects its gate terminal and one source/drain terminal to the first node N1 and connects its other source/drain terminal to the second node N2. In a case where a voltage at the first node N1 is higher than a voltage at the second node N2, the third transistor MN3 transmits a current from the first node N1 to the second node N2. In a case where the voltage at the second node is higher than N2 the voltage at the first node N1, the third transistor MN3 prevents a current from reversely flowing from the second node N2 toward the first node N1. Since the first and third transistors MN1 and MN3 actually perform a diode function, in some embodiments, they may be manufactured as a diode having the same characteristic.

One electrode (or one plate) of the first capacitor C1 is connected to the first node N1 and the other electrode is connected to the first oscillating signal OSC. The first capacitor C1 is designed to have a capacitance value sufficiently greater than capacitance values of all other parasitic capacitors formed in the first node N1. One electrode (or one plate) of the second capacitor C2 is connected to the second node N2 and the other electrode is connected to the second oscillating signal/OSC. The first capacitor C2 is designed to have a capacitance value sufficiently greater than capacitance values of all other parasitic capacitors formed in the second node N2. In some embodiments, it may be desirable that the capacitance value of the second capacitor C2 is smaller than the half the capacitance value of the first capacitor C1.

The circuit of FIG. 9 illustrates one unit charge pump circuit. When applied to a semiconductor memory device, an additional connection is possible in parallel or in series on a case-by-case basis. For example, in a case where the unit charge pump circuit has a pump ability of 3 volts, to make a pumping voltage being output become 9 volts, two constitutions of FIG. 9 without the first transistor MN1 have only to be added to the output terminal Vp. Also, to make a current capacity larger while maintaining a voltage as it is, the unit charge pump circuit has only to be constituted in parallel and an output voltage has only to be taken from one output stage.

An operation of the charge pump circuit of FIG. 9 is described below. If the power supply voltage Vcc is applied to the charge pump circuit, an initial voltage of the first node N1 is represented as a voltage obtained by subtracting a threshold voltage Vth1 of the first transistor MN1 from the power supply voltage Vcc, and an initial voltage of the second node N2 is represented as a voltage obtained by subtracting double a threshold voltage Vth1 of the first transistor MN1 (i.e., twice the threshold voltage Vth1) from the power supply voltage Vcc. If the first oscillating signal OSC transits from a ground voltage to the power supply voltage Vcc, since the main capacitor C1 has a capacitance value greater than a capacitance value of the first node N1, a voltage of the first node N1 is increased by a changed voltage level of the first oscillating signal OSC due to a capacitive coupling effect of the main capacitor C1. For example, the voltage of the first node N1 becomes a voltage increased by the power supply voltage Vcc from the initial voltage. For example, the voltage of the first node N1 increases to the combined voltage of the initial voltage and the power supply voltage Vcc. At this time, a level of the voltage of the first node N1 becomes a level obtained by subtracting the threshold voltage Vth1 from double the power supply voltage (i.e., twice the power supply voltage). Thus, a voltage of the second node N2 is represented as a voltage obtained by subtracting double the threshold voltage Vth1 from double the power supply voltage Vcc by the third transistor MN3. For example, in this embodiment, the voltage of the second node N2 may be equal to (2*Vcc)−(2*Vth1). As illustrated in the timing diagram of FIG. 10, the first oscillating signal OSC is input to the sub capacitor C2 with a time difference with respect to the second oscillating signal/OSC. If the second oscillating signal/OSC transitions from a ground voltage to the power supply voltage Vcc, a voltage change amount of the second oscillating signal/OSC is almost transmitted to the second node N2 by the a capacitive coupling effect of the second capacitor C2 and thereby a voltage of the second node N2 is represented as a level obtained by subtracting double the threshold voltage Vth2 from three times the power supply voltage Vcc. For example, in this embodiment, the voltage of the second node N2 may be equal to (3*Vcc)−(2*Vth2). When the voltage at the first node N1 is transmitted to the output terminal Vp through the second transistor MN2 (i.e., when the voltage at the first node N1, which is the source/drain terminal of the second transistor MN2, is a voltage of double the power supply voltage Vcc), a threshold voltage Vth2 of the second transistor MN2 and a voltage at the second node N2, which is the gate terminal of the second transistor MN2, becomes a voltage of three times the power supply voltage Vcc−double the threshold voltage Vth2 of the second transistor MN2. Accordingly, a voltage difference corresponding to a voltage of the power supply voltage Vcc (i.e., the threshold voltage Vth2 of the second transistor MN2 and thereby the voltage at the first node N1) is transmitted to the output terminal Vp without a voltage loss due to the second transistor MN2.

In FIG. 9, drain and source terminals of a transistor may be used interchangeably and a diode may be used instead of a transistor. In some embodiments, pumping capacity of the charge pump circuit can be increased by extending one unit charge pump circuit in series and/or in parallel.

Figure 11:
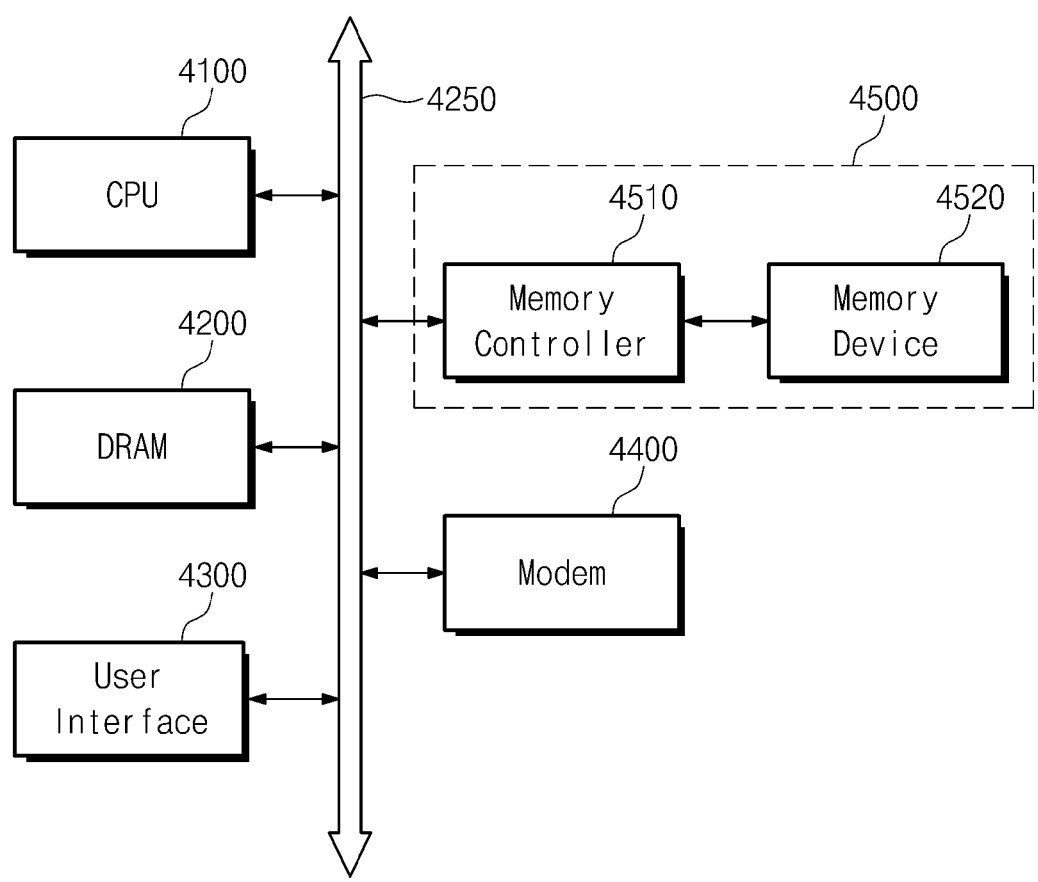
FIG. 11 is a block diagram illustrating an application example embodiment applied to a computing device.

FIG. 11 is a block diagram illustrating an application example applied to a computing device, according to certain disclosed embodiments.

Referring to FIG. 11, an exemplary computing device 4000 may include a memory system 4500, which includes a memory device 4520 and a memory controller 4510. The computing device 4000 may be, for example, an information processing device and/or a computer. The computing device 4000 may include a modem 4400, a CPU 4100, a DRAM 4200, and a user interface 4300, each of which may be electrically connected to one another and memory system 4500 and modem 4400 via a system bus 4250. Data processed by the CPU 4100 and data inputted from the outside may be stored in the memory system 4500.

The computing device 4000 may be applied, for example, to a solid state drive (SSD), a camera image sensor (CIS), and/or an application chipset. The memory system 4500 may be constituted by a SSD and, in some embodiments, the computing device 4000 can store large amounts of data in the memory system 4500.

In embodiments where the memory device 4520 is a DRAM, the memory controller 4510 may apply a command, an address, data, or a control signal to the memory device 4520 of the memory system 4500.

The memory device 4520 may be embodied by a volatile memory or a nonvolatile memory. The volatile memory may be, for example, a dynamic random access memory (DRAM), a static random access memory (SRAM), a thyristor RAM (TRAM), a zero capacitor RAM (Z-RAM), or a twin transistor RAM (TTRAM).

The CPU 4100 functions as a host and controls an overall operation of the computing device 4000.

A host interface between the CPU 4100 and the memory controller 4510 includes a variety of protocols for performing a data exchange between the host and the memory controller 4510. The memory controller 4510 may be configured to communicate with the host or to one or more devices outside the computing device 4000 through at least one of various protocols such as, for example, a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, and an integrated drive electronics (IDE) protocol.

The computing device 4000 may be provided as one of various constituent elements of electronic devices such as a computer, an ultra mobile PC (UMPC), a digital picture player, a digital video recorder, a digital video player, and one of various constituent elements constituting a radio frequency identification (RFID) device or a computing system.

As described in connection with FIG. 2, in the memory device 4520 or the DRAM 4200, a driving ability and current consumption of the charge pump circuit are differentially controlled in a structure in which a plurality of memory dies is loaded. Thus, not only an internal power supply capacity is stabilized but also an amount of currents being simultaneously consumed with respect to external power is reduced, thereby reducing a peak current.

In some embodiments, the memory system 4500 may be mounted using various types of packages.

Figure 12:
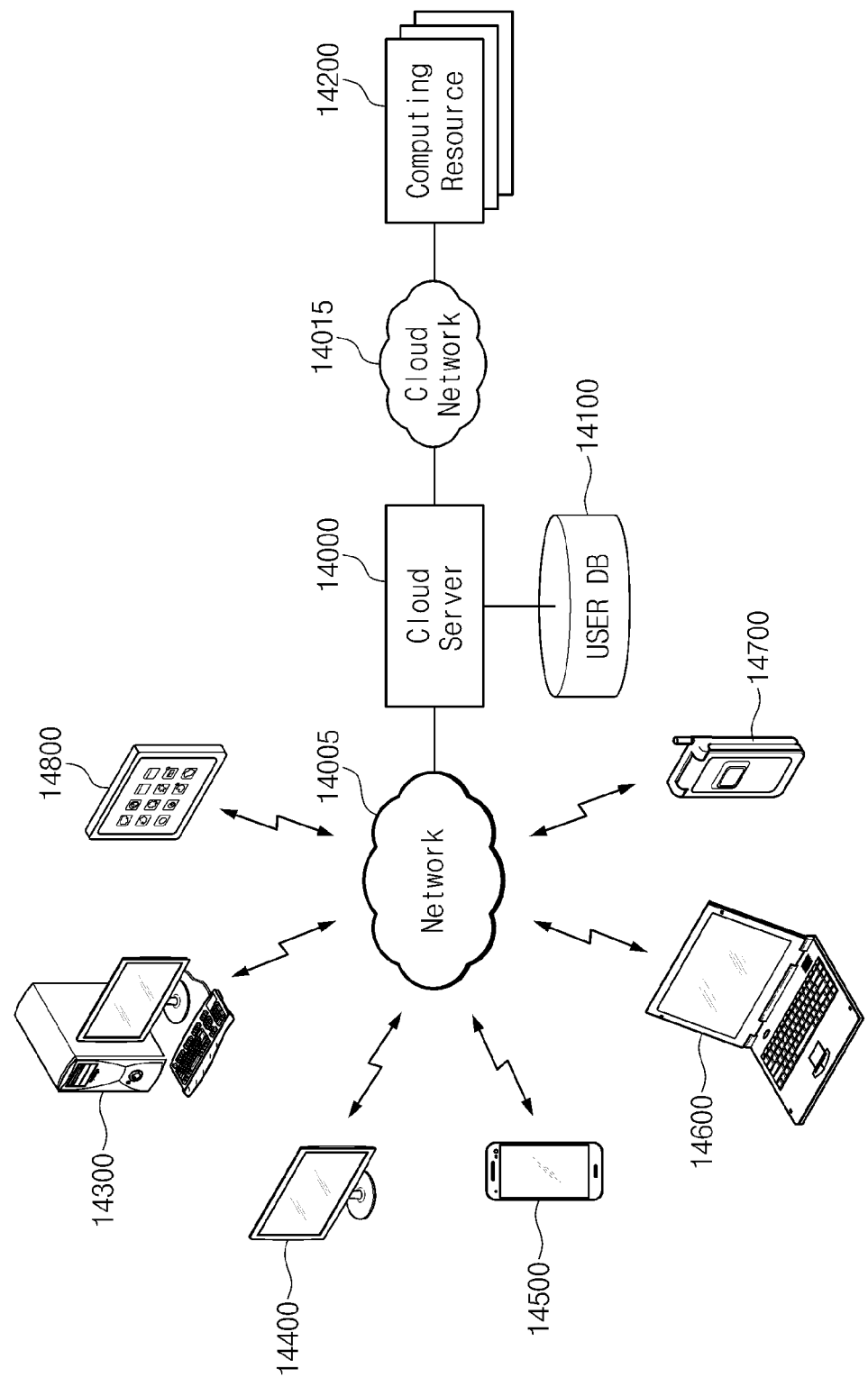
FIG. 12 is a block diagram illustrating an application example embodiment applied to a clouding system.

FIG. 12 is a block diagram illustrating an application example applied to a cloud system, according to certain disclosed embodiments.

Referring to FIG. 12, the cloud system may be constituted by a cloud server 14000, a user database (DB) 14100, a computing resource 14200, and a plurality of user terminals (e.g., a desk top PC 14300, a smart TV 14400, a smart phone 14500, a notebook PC 14600, a portable multimedia player (PMP) 14700, and a tablet PC 14800).

In some embodiments, a user terminal may be provided as one of various constituent elements of an electronic device.

The cloud system can provide an on-demand outsourcing service of a computing resource through an information communication network 14005 according to a request of the user terminal. Under a cloud computing environment, a service provider can consolidate computing resources of data centers that exist at different locations using a virtualization technology to provide a service needed by users.

Service users can use a service of a virtual space generated through a virtualization technology as much as they want when they want, but may not install computing resources, such as, for example, an application, storage, an operating system (OS), security, etc. at each user terminal.

A specific service user terminal accesses the cloud server 14000 through an information communication network 14005 including, for example, an internet and a mobile communication network. User terminals 14300-14700 can be provided with a cloud computing service, in particular, a video play service from the cloud server 14000. In FIG. 12, a desk top PC 14300, a smart TV 14400, a smart phone 14500, a notebook PC 14600, a PMP (portable multimedia player) 14700, and a tablet PC 14800 are illustrated as exemplary user terminals. However, they are only illustrative and the concepts are not limited thereto. All electronic devices capable of a network connection, whether wired and/or wireless or direct and/or indirect, may be the user terminal.

The cloud server 14000 can consolidate multiple computing resources 14200 distributed around the cloud network 14015 to provide to the user terminals 14300-14700. The multiple computing resources 14200 includes a variety of data services and may include, for example, data uploaded from one or more user terminals 14300-14700. The cloud server 14000 consolidates video databases distributed in several places using a virtualization technology to provide a service which may be used by one or more user terminals 14300-14700.

User information subscribed to a cloud computing service may be stored in the user DB 14100. The user information may include confidential, sensitive, or personally identifying information (PII), such as, for example, credit card information, credit history information, login information, home or email addresses, name, date of birth, age, gender, vehicle or driver information, etc. The user information may include a video index. The video index may include a list of a video of which a playback is completed, a list of a video being played and stop time of a video being played.

Information about a video stored in the user DB 14100 may be shared among user terminals 14300-14700. For example, in a case where a playback is requested from the notebook PC 14600 and then a predetermined video service is provided to the notebook PC 14600, a playback history of the predetermined video service is stored in the user DB 14100. In a case where the same video service playback request is received from the smart phone 14500, the cloud server 14000 plays the predetermined video service with reference to the user DB 14100.

The cloud server 14000 may refer to the playback history of the predetermined video service stored in the user DB 14100. For example, the cloud server 14000 receives a playback request with respect to a video stored in the user DB 14100 from one of user terminals 14300-14700. If the video is already being played, the cloud server 14000 may provide a video being played from the beginning or a video being played from a previous stop time as one of streaming methods according to a selection of the user terminal.

For example, in a case where one of the user terminals 14300-14700 requests that the video is played from the beginning, the cloud server 14000 stream or transmits the corresponding video to the requesting user terminal from a first frame. In a case where one of the user terminals 14300-14700 requests that the video is played from the previous stop time, the cloud server 14000 stream-transmits the corresponding video to the requesting user terminal from a frame of the stop time.

In this case, the semiconductor memory device described above may be included in the user terminal as a mobile DRAM and, as described in connection with FIG. 2, a driving ability and current consumption of the charge pump circuit may be differentially controlled in a structure in which a plurality of memory dies is loaded. Thus, not only an internal power supply capacity is stabilized but also an amount of currents being simultaneously consumed with respect to external power is reduced, thereby reducing a peak current. Operation performance or reliability of the cloud system may be improved.

The above-disclosed subject matter is to be considered illustrative, and not restrictive, and the appended claims are intended to cover all such modifications, enhancements, and other embodiments, which fall within the true spirit and scope of the disclosed concepts. Thus, to the maximum extent allowed by law, the scope of the embodiments is to be determined by the broadest permissible interpretation of the following claims and their equivalents, and shall not be restricted or limited by the foregoing detailed description.

What is claimed is:

1. A semiconductor memory device comprising:
   a plurality of memory dies including a first memory die and additional memory dies;
   a plurality of charge pump circuits installed on the plurality of memory dies, wherein the plurality of charge pump circuits includes a first charge pump circuit installed on the first memory die; and a first pump managing circuit which is installed on the first memory die, the first pump managing circuit configured to control the first charge pump circuit and receive operation state information with respect to the additional memory dies to generate one or more control signals for controlling the first charge pump circuit, wherein the one or more control signals comprise a signal that changes an oscillating clock period of an oscillating clock applied to the first charge pump circuit based on the operation state information of the additional memory dies.

2. The semiconductor memory device of claim 1, wherein the operation state information includes a power-up state with respect to additional memory dies.

3. The semiconductor memory device of claim 1, wherein the one or more control signals are further based on a current operation mode with respect to the first memory die.

4. The semiconductor memory device of claim 1, wherein the one or more control signals are further based on a voltage level detection information with respect to the first memory die.

5. The semiconductor memory device of claim 1, wherein the one or more control signals comprise a signal for turning on or off the first charge pump circuit.

6. The semiconductor memory device of claim 1, wherein the one or more control signals comprise a signal for involving pumping drive devices in the first charge pump circuit in a charge pumping operation.

7. The semiconductor memory device of claim 1, wherein the first memory die is configured so that the additional memory dies of the plurality of memory dies whose operation state information will be used to control the first charge pump circuit is set in advance.

8. The semiconductor memory device of claim 1, wherein each memory die includes a plurality of charge pump circuits, and the one or more control signals control the plurality of charge pump circuits of the first memory die.

9. The semiconductor memory device of claim 1, wherein the first pump managing circuit receives the operation state information with respect to the additional memory dies from the additional memory dies.

10. The semiconductor memory device of claim 1, wherein the first pump managing circuit is configured to generate the one or more controls signals for controlling the first charge pump circuit based on the operation state information of the additional memory dies.

11. A semiconductor memory device comprising:
a plurality of memory dies;
a plurality of voltage generators, wherein one voltage generator of the plurality of voltage generators is installed on one memory die of the plurality of memory dies and other voltage generators of the plurality of voltage generators are installed on other memory dies of the plurality of memory dies; and
power managing circuits, wherein one power managing circuit of the power managing circuits is installed on the one voltage generator of the plurality of voltage generators to manage the whole power of a package by controlling the one voltage generator and receiving operation state information with respect to the other memory dies to generate control signals for controlling the one voltage generator installed on the one memory die,
wherein the control signals comprise a signal that changes an oscillating clock period of an oscillating clock applied to the one voltage generator based on the operation state information of the other memory dies.

12. The semiconductor memory device of claim 11, wherein the memory dies are vertically stacked on a substrate.

13. The semiconductor memory device of claim 11, wherein each of the memory dies receives an address, a command, or data through a through substrate via.

14. The semiconductor memory device of claim 11, wherein the memory dies are horizontally disposed with respect to each other and are connected in common to one memory controller.

15. A semiconductor memory device comprising:
a plurality of memory dies;
a plurality of charge pump circuits, wherein one charge pump circuit of the plurality of charge pump circuits is installed on one memory die of the plurality of memory dies and other charge pump circuits of the plurality of charge pump circuits are installed on other memory dies of the plurality of memory dies; and
a plurality of pump managing circuits, wherein one pump managing circuit of the plurality of pump managing circuits is installed on one of the memory dies to control the one charge pump circuit and receive operation state information with respect to the other memory dies to generate control signals for controlling the one charge pump circuit installed on the one memory die,
wherein the control signals comprise a signal that changes an oscillating clock period of an oscillating clock applied to the one charge pump circuit based on the operation state information of the other memory dies.

16. The semiconductor memory device of claim 15, wherein the control signals are based on a current operation mode with respect to the one memory die.

17. The semiconductor memory device of claim 15, wherein the control signals are based on voltage level detection information with respect to the one memory die.

18. The semiconductor memory device of claim 15, wherein the control signals comprise a signal for turning on or off additional charge pump circuits installed on the one memory die.

* * * * *